United States Patent [19]
Seaman et al.

[11] Patent Number: 5,915,414
[45] Date of Patent: Jun. 29, 1999

[54] STANDARDIZED GAS ISOLATION BOX (GIB) INSTALLATION

[75] Inventors: George H. Seaman; Gary R. Thornberg, both of Colorado Springs, Colo.

[73] Assignee: LSI Logic Corporation, Milpitas, Calif.

[21] Appl. No.: 08/923,676

[22] Filed: Sep. 4, 1997

[51] Int. Cl.[6] .................................................. F16K 35/00
[52] U.S. Cl. ........................ 137/377; 137/382; 137/559; 137/883
[58] Field of Search ................................... 137/377, 382, 137/883, 559

[56] References Cited

U.S. PATENT DOCUMENTS

| | | | |
|---|---|---|---|
| 2,490,839 | 12/1949 | Shaffer et al. | 137/883 |
| 4,135,549 | 1/1979 | Baker | 137/883 |
| 4,738,693 | 4/1988 | Tom | 55/36 |
| 4,802,502 | 2/1989 | Williams | 137/382 |
| 5,020,570 | 6/1991 | Cotter | 137/377 |
| 5,152,313 | 10/1992 | Chapman, Jr. | 137/382 |
| 5,159,957 | 11/1992 | Hehl | 137/883 |
| 5,163,475 | 11/1992 | Gregoire | 137/597 |
| 5,188,671 | 2/1993 | Zinck et al. | 118/715 |
| 5,325,705 | 7/1994 | Tom | 73/31.03 |
| 5,732,744 | 3/1998 | Barr et al. | 138/106 |

FOREIGN PATENT DOCUMENTS

| | | | |
|---|---|---|---|
| 0791670 | 8/1997 | European Pat. Off. | C23C 16/44 |
| 1229317 | 3/1960 | France | 137/559 |

*Primary Examiner*—A. Michael Chambers
*Attorney, Agent, or Firm*—Wayne P. Bailey; Duke W. Yee

[57] ABSTRACT

To provide high purity gases to manufacturing tools, a gas isolation box is employed which is formed of stainless steel and includes vertical slots for receiving gas stick carrier cards. Gas sticks include required valves, gauges, and regulators rigidly mounted on stainless steel carrier cards, leak tested and labeled. The carrier cards with the rigidly mounted, leak tested gas sticks are slid into the vertical slots of the gas isolation box. Only two connections are then required to complete to gas lines, reducing the potential for flexing of high purity gas lines during installation.

15 Claims, 4 Drawing Sheets

STANDARDIZED GAS ISOLATION BOX (GIB) INSTALLATION

BACKGROUND OF THE INVENTION

1. Technical Field

The present invention relates generally to semiconductor manufacturing tools and in particular to mechanisms for delivering high purity gases to such semiconductor manufacturing tools. Still more particularly, the present invention relates to a method and apparatus for standardizing installation of high purity gas lines to semiconductor manufacturing equipment.

2. Description of the Related Art

Many tools within a semiconductor fab require the use of high purity gases, either toxic or nontoxic. Ultra high purity stainless steel piping, valves, gauges, and regulators are employed for such tools. During installation, the ultra high purity piping and fixturing is checked for particles (generally down to less than 0.01 microns), oxygen and moisture content, and leaks down to less than $10^{-9}$ atoms/cm$^3$.

During installation of a tool or gas line, many leaks are typically found, even after repeated leak testing and correction. A large number of these leaks are attributable to flexing of the ultra high purity lines after they have been tested. Such flexing may occur simply from turning on the regulators or by somehow hitting a tested line while working an adjacent line.

Although installation and leak testing of ultra high purity gas lines presents pervasive problems throughout the semiconductor manufacturing industry, no standard methods for installation and testing of systems exist. It would be desirable, therefore, to provide a standardized method and apparatus for installing and testing of ultra high purity gas lines to fab tools. It would further be advantageous if the standardized method and apparatus reduced instances of flexing of ultra high purity gas lines during installation.

SUMMARY OF THE INVENTION

To provide high purity gases to manufacturing tools, a gas isolation box is employed which is formed of stainless steel and includes vertical slots for receiving gas stick carrier cards. Gas sticks include required valves, gauges, and regulators rigidly mounted on stainless steel carrier cards, leak tested and labeled. The carrier cards with the rigidly mounted, leak tested gas sticks are slid into the vertical slots of the gas isolation box. Only two connections are then required to complete to gas lines, reducing the potential for flexing of high purity gas lines during installation.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1:
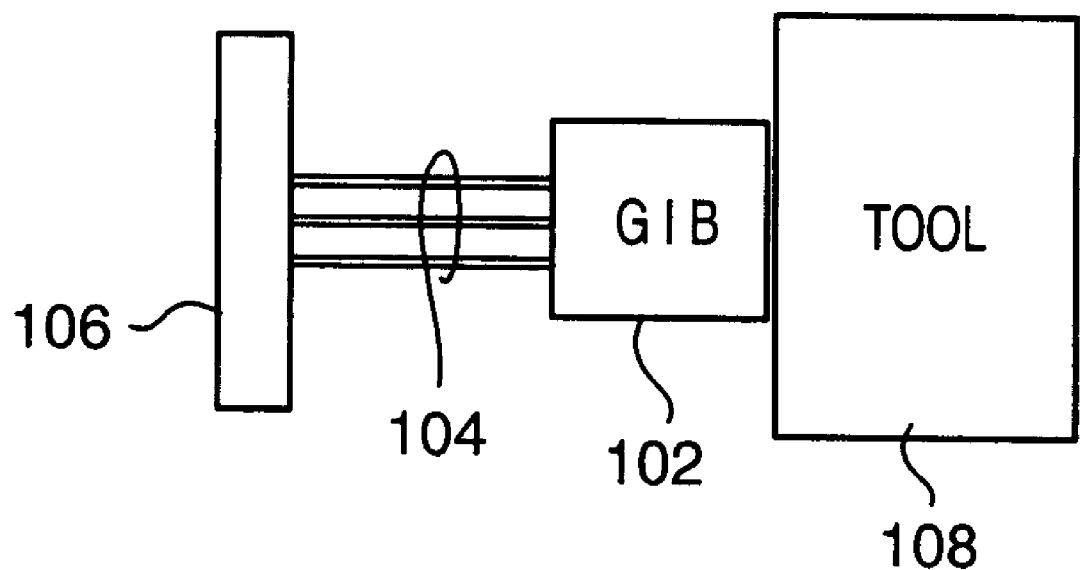
FIG. 1 depicts a block diagram of a semiconductor manufacturing tool fitted with a gas isolation box in accordance with a preferred embodiment of the present invention.

With reference now to the figures, and in particular with reference to FIG. 1, a block diagram of a semiconductor manufacturing tool fitted with a gas isolation box in accordance with a preferred embodiment of the present invention is depicted. Gas isolation box 102 is connected to a plurality of gas lines 104 carrying process gases and/or purge media from a supply such as gas panel 106. Gas isolation box 102 is mounted on or adjacent to tool 108, which may be, for example, a chemical vapor deposition tool or a plasma etch tool. Gas isolation box 102 is connected to and provides transmission of process gases and/or purge media from gas panel 106 to tool 108.

Figure 2A:
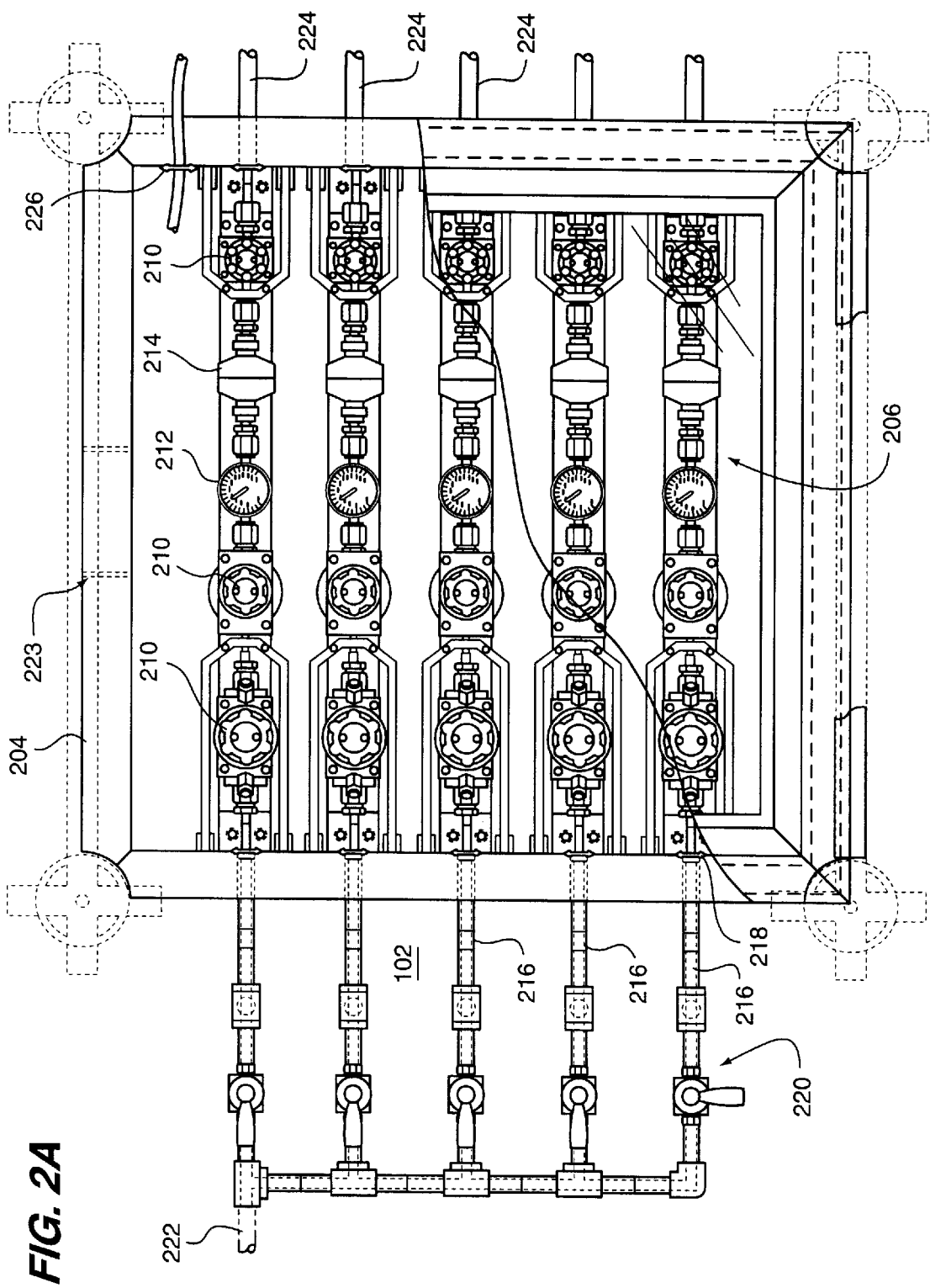
FIGS. 2A–2B are various views of a gas isolation box for connecting high purity gas lines to a manufacturing tool in accordance with a preferred embodiment of the present invention.
Figure 2B:
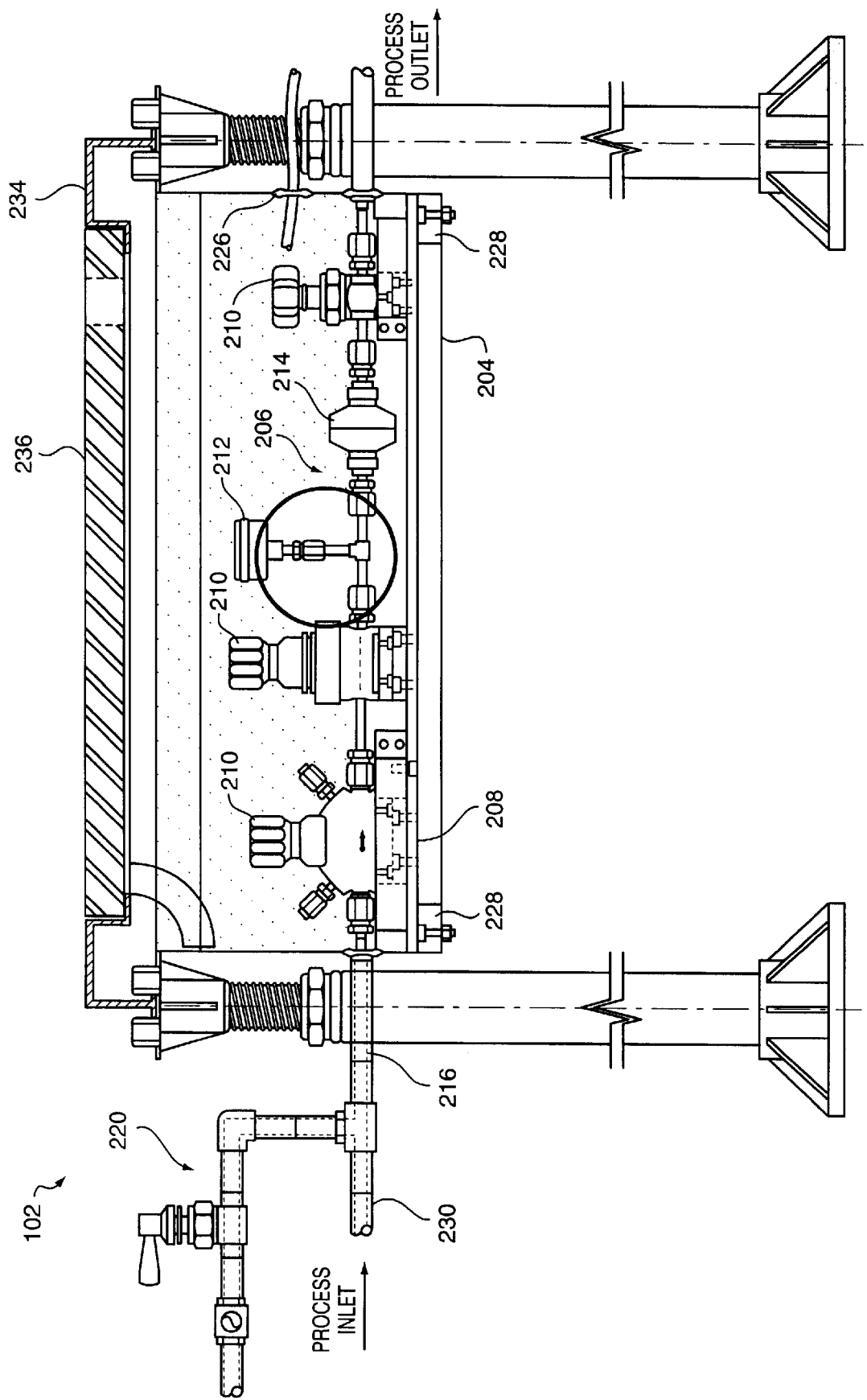

Referring not to FIGS. 2A and 2B, various views of a gas isolation box for connecting high purity gas lines to a manufacturing tool in accordance with a preferred embodiment of the present invention are depicted. FIG. 2A depicts a plan view of gas isolation box 102, which includes a card cage, an exhausted stainless steel box 204 adapted to house a plurality of gas sticks 206 mounted on stainless steel carrier cards 208. An exhausted stainless steel box is constructed of stainless steel that has been processed to remove impurities from the stainless steel. Each gas stick 206 includes a series of valves 210, gauges 212, and/or regulators 214 required which are rigidly mounted on carrier cards 208.

Assembled and mounted gas sticks 206 are leak tested and labeled prior to insertion into gas isolation box 102. Only two connections are then required to complete a gas line after the gas sticks 206 are mounted within gas isolation box 102. Carrier cards 208 with mounted and tested gas sticks 206 slid into positive connection vertical slots within gas isolation box 102.

Inlet lines 216 to the gas sticks 206 within gas isolation box 102 are welded gas lines connected to gas sticks 206 by VCR face seal fittings. The connections of inlet lines 216 to gas isolation box 102 include grommets 218. Inlet lines 216 provide connections to both a gas panel connected to the process gas cylinders and to purge assembly 220. Purge assembly 220 allows selection of purge media from purge media supply line 222 to purge secondary containment of inlet lines 216 to enable monitoring of leak detection. Stainless steel box 204 includes an exhaust vent 223 for gas isolation box 102.

Outlet lines 224 are also welded gas lines connected to gas sticks 206 by VCR face seal fittings, with grommeted connections. A grommeted inlet 226 may also be provided in gas isolation box 102 for connection to an MDA sample tube (not shown).

FIG. 2B is an elevation view of gas isolation box 102. Carrier cards 208 with rigidly mounted gas sticks 206 are mounted in exhausted stainless steel box 204 on mounting platforms 228. Inlet lines 216 include connections to purge assembly 220 and to process gas lines 230 from gas panel or gas manifold box. Gas isolation box 102 may be mounted on pedestals 232. Gas isolation box 102 may also include top assembly 234 with a clear portion 236 formed of a substance such as Lexan.

Figure 3:
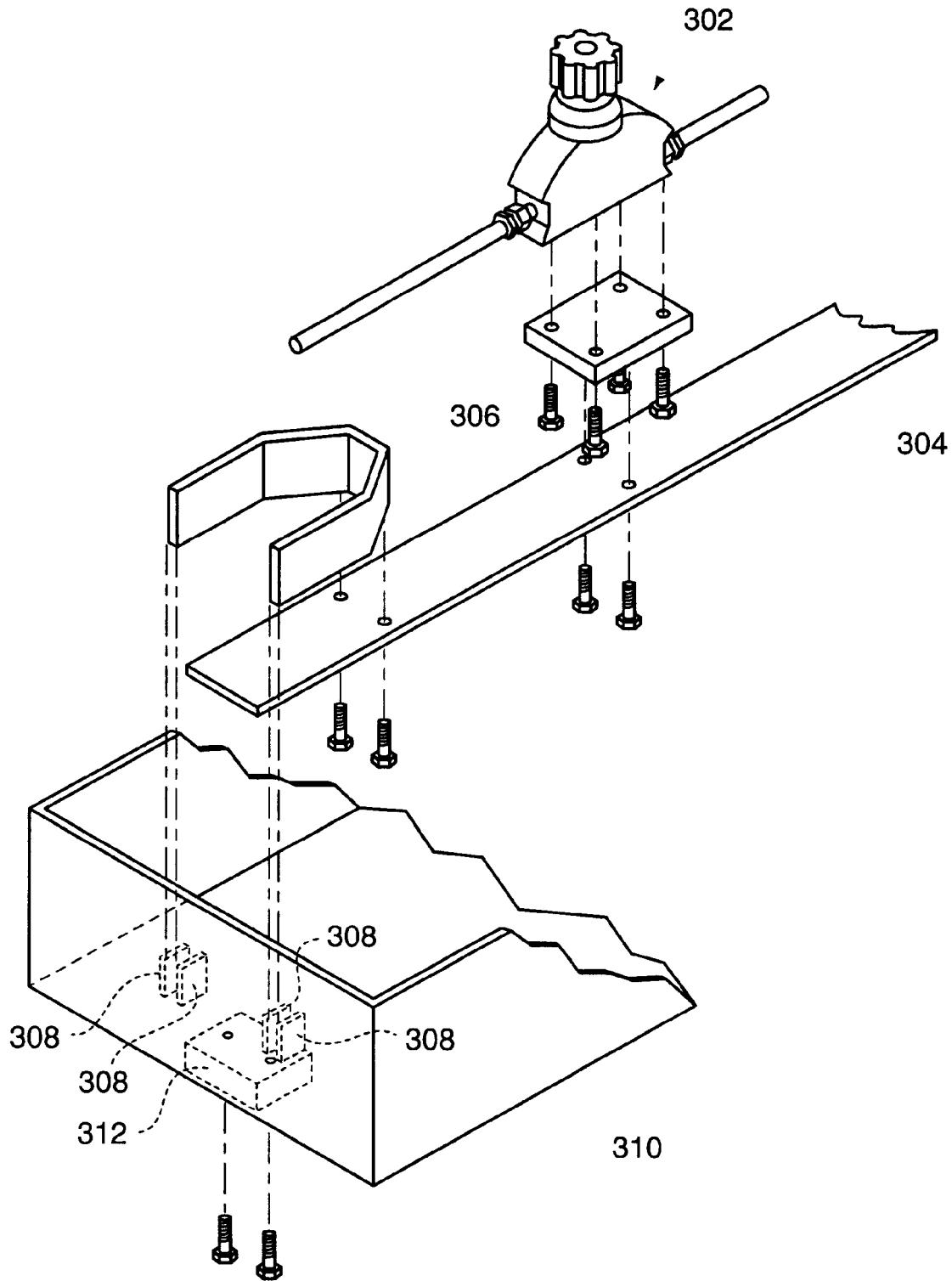
FIG. 3 is a detail depicting a mounting system for carrier cards in a gas isolation box in accordance with a preferred embodiment of the present invention.

Referring to FIG. 3, a detail depicting a mounting system for carrier cards in a gas isolation box in accordance with a preferred embodiment of the present invention is illustrated. Gas sticks 302 are rigidly mounted on carrier cards 304, which includes a mounting bracket 306. The ends of mounting bracket 306 are adapted to be received by receiving brackets 308 within card cage 310 when carrier card 304 is resting on mounting platform 312. In this manner, carrier cards with rigidly mounted gas sticks may be slid vertically into the gas isolation box.

The gas isolation box of the present invention, with gas sticks rigidly mounted on carrier cards and leak tested prior to installation in the gas isolation box, decouples the formation and testing of high purity gas line controls from connection of the gas lines to a tool. This reduces the potential for accidentally bumping an adjacent, previously tested gas line while installing controls on a high purity gas line of interest. Leak tested and installed high purity gas lines are thus less likely to indicate additional leaks upon subsequent testing. Additionally, connection of a gas source to the tool is reduced to two connections to VCR fittings on the gas isolation box, further reducing the potential for accidental disturbance of existing lines. The rigid mounting of the gas line controls on the carrier cards reduces the possibility of disturbing the gas line while turning a valve.

The description of the preferred embodiment of the present invention has been presented for purposes of illustration and description, but is not intended to be exhaustive or limit the invention in the form disclosed. Many modifications and variations will be apparent to those of ordinary skill in the art. The embodiment was chosen and described in order to best explain the principles of the invention and the practical application to enable others of ordinary skill in the art to understand the invention for various embodiments with various modifications as are suited to the particular use contemplated.

What is claimed is:

1. A gas isolation box, comprising:
   a box including a plurality of slots for receiving carrier cards;
   a gas stick mounted on a carrier card inserted into a slot within said plurality of slots; and connections on said box for connecting said gas stick to a gas supply and a tool.

2. The gas isolation box of claim 1, wherein said box comprises exhausted stainless steel.

3. The gas isolation box of claim 1, wherein said slots comprise vertical slots.

4. The gas isolation box of claim 1, wherein said gas stick is rigidly mounted on said carrier card, leak tested, and labeled.

5. The gas isolation box of claim 1, wherein said gas stick further comprises series connected gas line controls selected from the group consisting of valves, gauges, and regulators.

6. The gas isolation box of claim 1, further comprising:
   a mounting bracket attached to said carrier card and including a plurality of ends;
   brackets on said box receiving said ends of said mounting bracket.

7. The gas isolation box of claim 1, wherein said connections further comprise VCR fittings.

8. The gas isolation box of claim 1 further comprising:
   a top assembly having a clear portion, wherein said top assembly is removably affixed to said box.

9. A device for semiconductor manufacturing, comprising:
   a semiconductor manufacturing tool; and
   a gas isolation box including a plurality of slots for receiving carrier cards and at least one gas line control mounted on a carrier card inserted into a slot within said plurality of slots, said gas isolation box connected to said tool and for transmitting gas from a gas supply to said tool through said gas line control.

10. The device of claim 9 wherein the gas isolation box further comprises a top assembly having a clear portion, wherein said top assembly is removably affixed to said box.

11. An apparatus for use with a semiconductor tool, said apparatus comprising:
   a rigid box;
   a card cage mounted within said box;
   a plurality of carrier cards attached to said card cage;
   a gas stick mounted on each of said carrier cards.

12. The apparatus of claim 11 wherein the gas stick further comprises series connected gas line controls selected from the group consisting of valves, gauges, and regulators.

13. The apparatus of claim 11 wherein the gas stick is mounted on said carrier card, leak tested, and labeled before its associated carrier card is attached to said card cage.

14. The apparatus of claim 11 further comprising:
   a top assembly having a clear portion, wherein said top assembly is removably affixed to said box.

15. The apparatus of claim 11 wherein said carrier card further comprises mounting brackets adapted to be received by receiving brackets for mounting on said card cage.

* * * * *